United States Patent
Cai et al.

(10) Patent No.: US 12,453,183 B2
(45) Date of Patent: Oct. 21, 2025

(54) SEMICONDUCTOR DEVICE WITH LOW POTENTIAL TERMINALS CONNECTED TO WELLS

(71) Applicant: XIAMEN SAN'AN INTEGRATED CIRCUIT CO., LTD., Xiamen (CN)

(72) Inventors: Wenbi Cai, Xiamen (CN); Cheng Liu, Xiamen (CN); Nien-Tze Yeh, Xiamen (CN); Yuci Lin, Xiamen (CN); Jie Zhao, Xiamen (CN); Yuyu Liang, Xiamen (CN); Jian Yang, Xiamen (CN)

(73) Assignee: HUNAN SAN'AN SEMICONDUCTOR CO., LTD., Hunan (CN)

( * ) Notice: Subject to any disclaimer, the term of this patent is extended or adjusted under 35 U.S.C. 154(b) by 435 days.

(21) Appl. No.: 17/586,049

(22) Filed: Jan. 27, 2022

(65) Prior Publication Data
US 2022/0149034 A1    May 12, 2022

Related U.S. Application Data

(63) Continuation-in-part of application No. PCT/CN2020/103335, filed on Jul. 21, 2020.

(30) Foreign Application Priority Data

Jul. 31, 2019  (CN) .......................... 201910702386.3

(51) Int. Cl.
*H01L 27/02*    (2006.01)
*H01L 21/8252*  (2006.01)
(Continued)

(52) U.S. Cl.
CPC ......... *H10D 89/10* (2025.01); *H01L 23/5384* (2013.01); *H01L 23/5386* (2013.01); *H10D 84/05* (2025.01); *H10D 84/403* (2025.01)

(58) Field of Classification Search
None
See application file for complete search history.

(56) References Cited

U.S. PATENT DOCUMENTS

2012/0153300 A1*  6/2012  Lidow ................. H01L 29/7787
                                                     257/77
2015/0034972 A1*  2/2015  Kuraguchi ............... H10D 8/00
                                                     257/77
(Continued)

FOREIGN PATENT DOCUMENTS

CN    103329256 A    9/2013
CN    104347698 A    2/2015

OTHER PUBLICATIONS

International Search Report issued to PCT Application No. PCT/CN2020/103335 on Sep. 21, 2020.

*Primary Examiner* — Peter Bradford
(74) *Attorney, Agent, or Firm* — MUNCY, GEISSLER, OLDS & LOWE, P.C.

(57) ABSTRACT

A microelectronic device includes a substrate, at least two doped well regions, an epitaxial structure, and at least two power elements. The doped well regions are disposed in the substrate, and are spaced apart from each other. Each of the doped well regions has a doping type opposite to that of the substrate. The epitaxial structure is disposed on the substrate, and is in contact with the doped well regions. The power elements are disposed on the epitaxial structure opposite to the substrate, and are cascade connected with each other. A low potential terminal of each of the power elements is electrically connected to a respective one of the doped well regions. A method for making the microelectronic device is also provided.

12 Claims, 3 Drawing Sheets

(51) Int. Cl.
  *H01L 23/538*   (2006.01)
  *H01L 27/07*    (2006.01)
  *H10D 84/05*    (2025.01)
  *H10D 84/40*    (2025.01)
  *H10D 89/10*    (2025.01)

(56) References Cited

U.S. PATENT DOCUMENTS

2017/0148905 A1* 5/2017 Tipirneni ............ H01L 29/7786
2018/0076288 A1* 3/2018 Chang ............... H01L 21/76229
2020/0013906 A1* 1/2020 Boles ................ H01L 21/02129
2020/0105741 A1* 4/2020 Lin ..................... H10D 30/015

* cited by examiner

US 12,453,183 B2

SEMICONDUCTOR DEVICE WITH LOW POTENTIAL TERMINALS CONNECTED TO WELLS

CROSS-REFERENCE TO RELATED APPLICATION

This application is a bypass continuation-in-part application of PCT international Application No. PCT/CN2020/103335 filed on Jul. 21, 2020, which claims priority of Chinese Invention Patent Application No. 201910702386.3 filed on Jul. 31, 2019. The entire content of each of the international and Chinese patent application is incorporated herein by reference.

FIELD

The disclosure relates to a semiconductor device and a method for making the same, and more particularly to a microelectronic device and a method for making the same.

BACKGROUND

Gallium nitride (GaN) is a wide bandgap semiconductor material, and, as compared with silicon, has the advantages of higher breakdown strength, higher electron mobility and lower intrinsic carrier concentration. A GaN-based electrical device has excellent performances, such as a high operating voltage, a low on-state resistance, and a high operating frequency, which is adapted for use in a next generation power conversion device having a high efficiency and a high power density. A GaN-based integrated circuit can be used to maximize the performance of a GaN-based power conversion system. A GaN switching device and a GaN-based integrated circuit are monolithically integrated, which can not only reduce the weight of a power module, but also increase the stability and efficiency of the power module under complicated operating conditions.

The stability of a GaN-based integrated circuit is evaluated based on the stability of discrete GaN device during a switching event, and the stability of multiple GaN devices in different operating conditions.

In current monolithically integrated half-bridge structure of a GaN-based electrical device or circuit, the substrate might have an electrical stress different from that of each of the upper and lower power elements, which would adversely affect the performances of the upper and lower power elements.

SUMMARY

An object of the disclosure is to provide a microelectronic device and a method for making the same, which can alleviate or overcome the aforesaid shortcomings of the prior art.

According to a first aspect of the disclosure, a microelectronic device includes a substrate, at least two doped well regions, an epitaxial structure, and at least two power elements.

The at least two doped well regions are disposed in the substrate, and are spaced apart from each other. Each of the at least two doped well regions has a doping type opposite to that of the substrate.

The epitaxial structure is disposed on the substrate, and is in contact with the at least two doped well regions.

The at least two power elements are disposed on the epitaxial structure opposite to the substrate, and are cascade connected with each other. Each of the at least two power elements has a high potential terminal and a low potential terminal.

Each of the at least two power elements is disposed in correspondence with a respective one of the at least two doped well regions, and the low potential terminal of each of the at least two power elements is electrically connected to the respective one of the at least two doped well regions.

According to a second aspect of the disclosure, a method for making a microelectronic device includes the steps of:
a) providing a substrate;
b) forming at least two doped well regions in the substrate that are spaced apart from each other, each of the at least two doped well regions having a doping type opposite to that of the substrate;
c) forming an epitaxial structure on the substrate, the epitaxial structure being in contact with the at least two doped well regions; and
d) forming at least two power elements on the epitaxial structure opposite to the substrate, the at least two power elements being cascade connected with each other, each of the at least two power elements having a high potential terminal and a low potential terminal, and being disposed in correspondence with a respective one of the at least two doped well regions, the low potential terminal of each of the at least two power elements being electrically connected to the respective one of the at least two doped well regions.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
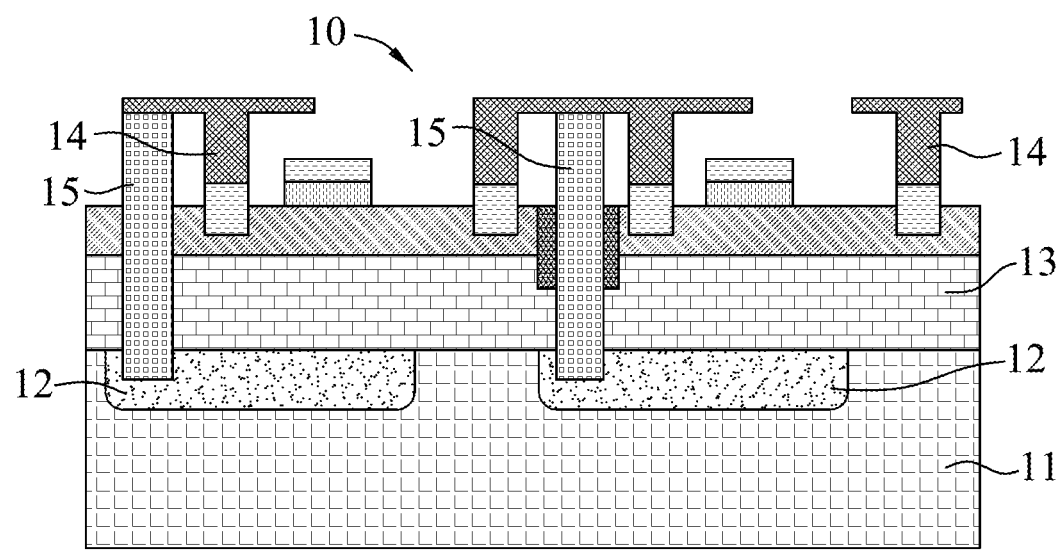
FIG. 1 is a schematic cross-sectional view illustrating an embodiment of a microelectronic device according to the disclosure.

Before the disclosure is described in greater detail, it should be noted that where considered appropriate, reference numerals have been repeated among the figures to indicate corresponding or analogous elements, which may optionally have similar characteristics.

Referring to FIG. 1, an embodiment of a microelectronic device 10 according to the present disclosure includes a substrate 11, at least two doped well regions 12, an epitaxial structure 13, and at least two power elements 14.

The substrate 11 may be a silicon (Si) substrate, a silicon-on-insulator (SOI) substrate, a silicon carbide (SiC) substrate having a better breakdown strength for a PN junction, combinations thereof, or other suitable substrates for epitaxially growing a gallium nitride (GaN) material layer thereon.

Figure 2:
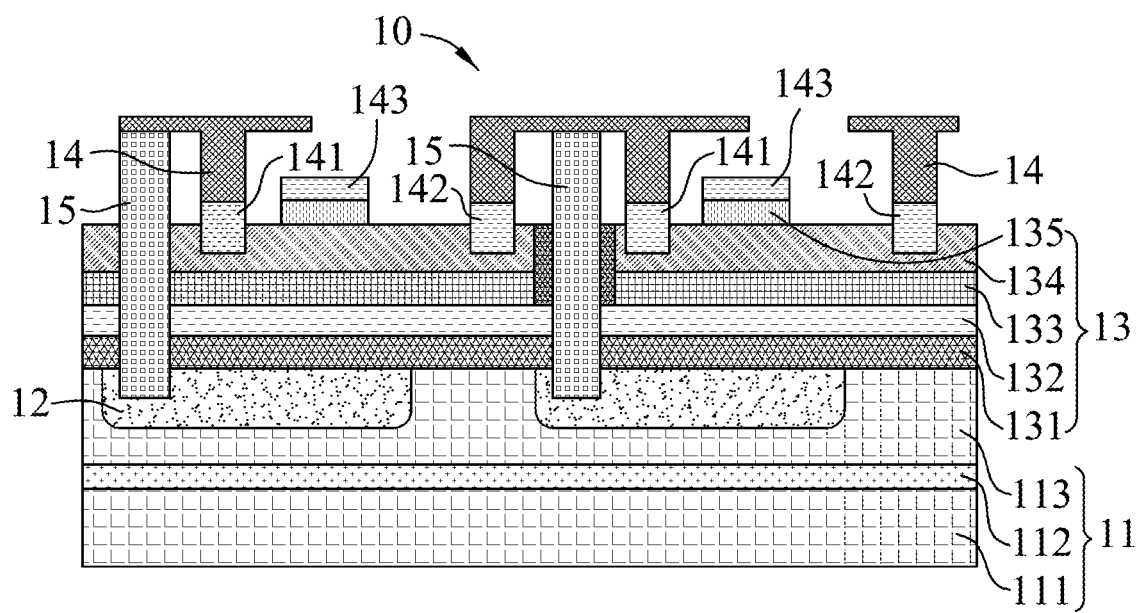
FIG. 2 is a schematic cross-sectional view illustrating a variation of the embodiment.

In a variation of the embodiment shown in FIG. 2, the substrate 11 is the SOI substrate, and includes a back substrate 111, a Si layer 113 disposed on the back substrate 111, and a buried oxide layer 112 disposed between the back substrate 111 and the Si layer 113. The buried oxide layer 112 may be formed on the back substrate 111 using separation by implantation of oxygen (SIMOX), which involves oxygen implantation and high temperature annealing procedure. The buried oxide layer 112 is capable of providing the Si layer 113 a better electrical insulation, which is conducive for lowering requirements for a doping concentration and a depth of the doped well regions 12.

The doped well regions 12 are disposed in the substrate 11 and are spaced apart from each other. The number of the doped well region 12 can be practically adjusted according to the number of the power element 14.

Specifically, the doped well regions 12 may be formed by (i) forming a photoresist layer on the substrate 11 by e.g., a coating process, (ii) exposing and developing the photoresist layer using a photomask to expose a portion of the substrate 11 (i.e., doping region), and (iii) doping the exposed portion of the substrate 11 by ion implantation combined with one of a high temperature activation and a thermal diffusion. The photoresist layer may be a reversal photoresist, such as AZ 5214E or SPR 220. The photoresist layer may have a thickness of about 1 µm.

After formation of the doped well regions 12, the photoresist layer may be removed using an organic solvent, such as N-methyl-2-pyrrolidone (NMP) or acetone. In some embodiments, after removal of the photoresist layer, the substrate 11 may be cleaned using an oxygen plasma to avoid formation of a residual photoresist layer.

In this embodiment, in order to avoid ion migration between two adjacent doped well regions 12, a distance between the two adjacent doped well regions 12 is not smaller than 1 µm. In addition, each of the doped well regions 12 may have a depth ranging from 0.1 µm to 10 µm.

It is known that when a semiconductor (e.g., silicon) is doped with an acceptor (e.g., boron) to increase the number of free positive charge carrier (i.e., hole), the semiconductor can be a P-type semiconductor or has a P-type doping. When the semiconductor is doped with a donor (e.g., phosphorus) to increase the number of free negative charge carrier (i.e., electron), the semiconductor can be an N-type semiconductor or has an N-type doping.

In this embodiment, in order to achieve an electrical isolation between the power elements 14 through the spaced-apart doped well regions 12, a PN junction is formed between each of the doped well regions 12 and the substrate 11. Therefore, each of the doped well regions 12 has a doping type opposite to that of the substrate 11. In some embodiments, the doping type of the substrate 11 is P-type, and the doping type of each of the doped well regions 12 is N-type. In some embodiments, the doping type of the substrate 11 is N-type, and the doping type of each of the doped well regions 12 is P-type.

When the doping type of each of the doped well regions 12 is N-type, each of the doped well regions 12 may be doped with one of a phosphorus impurity and an arsenic impurity, and may have a doping concentration ranging from $10^{17}/cm^3$ to $10^{20}/cm^3$. When the doping type of each of the doped well regions 12 is P-type, each of the doped well regions 12 may be doped with one of an aluminum impurity and a boron impurity, and may have a doping concentration ranging from $10^{17}/cm^3$ to $10^{20}/cm^3$.

The epitaxial structure 13 is disposed on the substrate 11, and is in contact with the doped well regions 12. The epitaxial structure 13 may be formed on the substrate 11 using, for example, but not limited to, epitaxial growth techniques, such as, metal-organic chemical vapor deposition (MOCVD), hydride vapor phase epitaxy (HVPE), molecular beam epitaxy (MBE), combinations thereof, or other suitable techniques.

Figure 3:
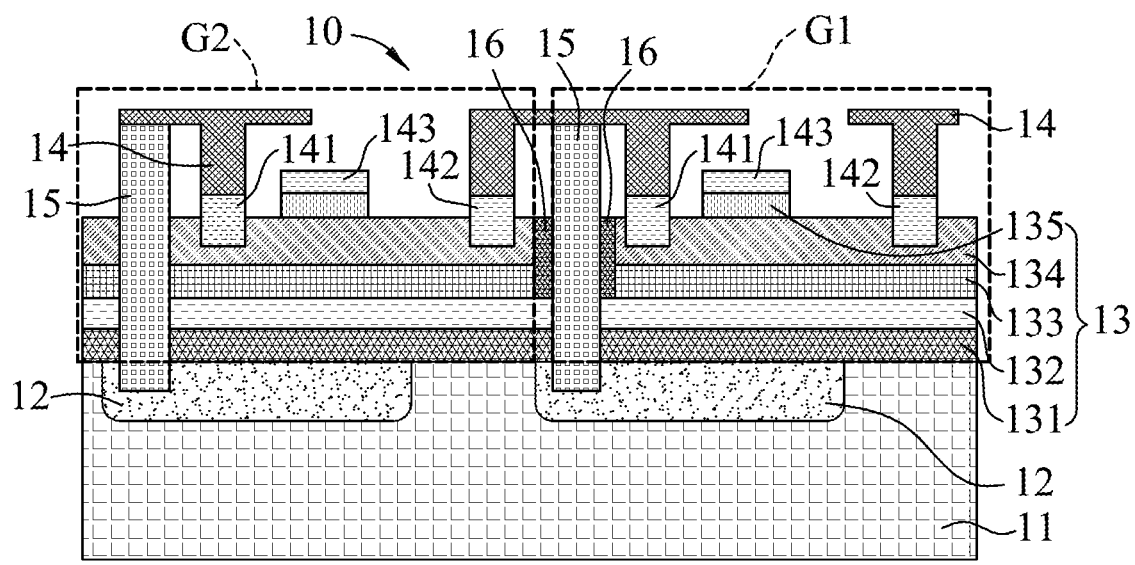
FIG. 3 is a schematic cross-sectional view illustrating another variation of the embodiment.

As shown in FIGS. 2 and 3, the epitaxial structure 13 includes a buffer layer 131, a highly resistive layer 132, a channel layer 133, and a barrier layer 134.

The buffer layer 131 is disposed on the substrate 11, and is in contact with the doped well regions 12. The highly resistive layer 132 is disposed on the buffer layer 131 opposite to the substrate 11. The channel layer 133 is disposed on the highly resistive layer 132 opposite to the buffer layer 131. The barrier layer 134 is disposed on the channel layer 133 opposite to the highly resistive layer 132. An example of a material for making each of the buffer layer 131, the highly resistive layer 132, and the channel layer 133 may include, but is not limited to, GaN. Examples of a material for making the barrier layer 134 may include, but are not limited to, aluminum gallium nitride (AlGaN), aluminum nitride (AlN), indium aluminum nitride (InAlN), combinations thereof, or other suitable materials that can cooperate with the channel layer 133 (e.g., made of GaN) to form a two-dimensional electron gas.

The power elements 14 are disposed on the epitaxial structure 13 opposite to the substrate 11, and are cascade connected with each other to form a multifunctional circuit. In some embodiments, the power elements 14 may be cascade connected with each other using on-chip metal interconnection (not shown) or an off-chip print circuit board (not shown).

In this embodiment, each of the power elements 14 may be a metal oxide semiconductor field effect transistor or a diode. Examples of the power elements 14 include enhancement-type device (E-mode high electron mobility transistor (HEMT), depletion-type device (D-mode HEMT), lateral field-effect rectifier (L-FER), or Schottky barrier diode (SBD). Examples of the E-mode HEMT may include, but are not limited to, P-GaN gate HEMT, P-AlGaN gate HEMT, recessed-gate metal-insulator-semiconductor (MIS) HEMT, or HEMT having fluorine ions implanted into a gate thereof.

Each of the power elements 14 has a high potential terminal and a low potential terminal. Each of the power elements 14 is disposed in correspondence with a respective one of the doped well regions 12, and the low potential terminal of each of the power elements 14 is electrically connected to the respective one of the doped well regions 12.

Specifically, the microelectronic device 10 may further include at least two conductive vias 15 that are spaced apart from each other, and that penetrate through the epitaxial structure 13 to respectively contact the doped well regions 12. The low potential terminal of each of the power elements 14 is electrically connected to the respective one of the doped well regions 12 through a respective one of the conductive vias 15. Each of the conductive vias 15 may include a conductive material, e.g., silver, copper, gold, aluminum, or combinations thereof. In some embodiments, each of the conductive vias 15 may extend into the respective one of the doped well regions 12. It is noted that the number of the conductive via 15 is not smaller than that of the power element 14, and each of the conductive vias 15 is located in correspondence with the respective one of the doped well regions 12 and a respective one of the power elements 14, so as to electrically connect the respective one of the doped well regions 12 and the respective one of the power elements 14.

There are no particular limitations on the shape of each of the conductive vias 15, as long as each of the conductive vias 15 can penetrate through the epitaxial structure 13 and extend into the respective one of the doped well regions 12. Each of the conductive vias 15 has a cross-section having a shape of, e.g., a circular shape, a square shape, or a rectangular shape.

The conductive vias 15 may be formed by etching the epitaxial unit 13. In some embodiments, each of the conductive vias 15 may be formed by etching the epitaxial structure 13 to form a through hole that penetrates the epitaxial structure 13 and that terminates at a surface of the respective one of the doped well regions 12, and then filling the conductive material in the through hole. In some embodiments, the through hole of each of the conductive vias 15 may be formed to penetrate the epitaxial structure 13 and extend into the respective one of the doped well regions 12, thereby forming a recess in the respective one of the doped well regions 12 (see FIG. 3). There are no particular limitations on a depth of each of the conductive vias 15.

In this embodiment, when each of the power elements 14 is a metal oxide semiconductor field effect transistor, the epitaxial structure 13 may further include a P-type semiconductor layer 135 for forming an enhancement-type device (see FIGS. 2 and 3). The P-type semiconductor layer 135 may be made from GaN or AlGaN. The P-type semiconductor layer 135 may be formed on the barrier layer 134 opposite to the channel layer 133. The metal oxide semiconductor field effect transistor has a source 141, a drain 142, and a gate 143. The source 141 and the drain 142 are formed at two opposite sides of the P-type semiconductor layer 135, and the gate 143 is formed on the P-type semiconductor layer 135. The source 141 of the metal oxide semiconductor field effect transistor acts as the low potential terminal of the metal oxide semiconductor field effect transistor, and is electrically connected to the respective one of the doped well regions 12 through the respective one of the conductive vias 15.

Figure 4:
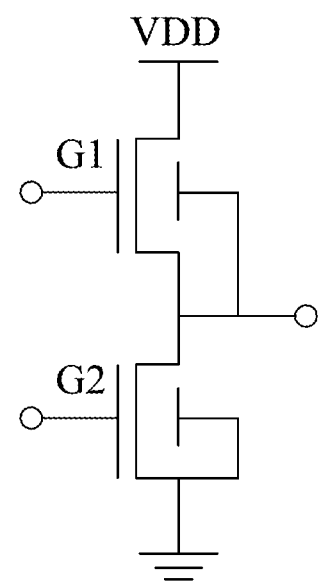
FIG. 4 is a schematic circuit diagram illustrating a cascade connection of two power elements of the embodiment.

Referring to FIGS. 3 and 4, in the microelectronic device 10 having two power elements 14 (G1, G2) which has the cascade connection configuration, the source 141 of one of the power elements 14 (G1), which is a high potential terminal of an integrated circuit (the microelectronic device 10), is electrically connected to the substrate 11 through the respective one of the doped well regions 12. Similarly, the source 141 of the other one of the power elements 14 (G2), which is the low potential terminal of the integrated circuit (the microelectronic device 10), is electrically connected to the substrate 11 through the respective one of the doped well regions 12. Each of the substrate 11, and the sources 141 of the power elements 14 (G1, G2) has the same potential, so as to prevent electrons in the channel layer 133 from being captured by defects in the epitaxial structure 13, and avoid the change or degradation on the performance of the power elements 14 (G1, G2).

In some embodiments, each of the power elements 14 may include a diode, and a cathode of the diode of each of the power elements 14 acts as the low potential terminal and is electrically connected to the respective one of the doped well regions 12 through the respective one of the conductive vias 15, which exhibits the same effect as described above.

The microelectronic device 10 may further include an isolation structure 16. The isolation structure 16 is formed in the epitaxial structure 13, and is located between the power elements 14, so as to electrically isolate a first portion of the channel layer 133 and a second portion of the channel layer 133 that are in correspondence with the respective power elements 14. The isolation structure 16 may be a trench, or may be formed by ion implantation of an isolation substance in the epitaxial structure 13. In addition, the isolation structure 16 can electrically isolate a first portion of the barrier layer 134 and a second portion of the barrier layer 134 that are in correspondence with the respective one of the power elements 14.

There are no particular limitations on the location of the isolation structure 16, as long as the isolation structure 16 can electrically isolate the power elements 14. In this embodiment, the isolation structure 16 is located at two opposite sides of one of the conductive vias 15 located between the power elements 14, so as to electrically isolate the first and second portions of the channel layer 133. In some embodiments, the isolation structure 16 may be disposed at one side of one of the conductive vias 15 located between the power elements 14.

By having the PN junction formed between the substrate 11 and each of the doped well regions 12, the potential of each of the power elements 14 and the substrate 11 can be separately controlled. Moreover, by having the isolation structure 16, the power elements 14 can be electrically isolated from each other. As such, reliability of the microelectronic device 10 (e.g., Si-based GaN integrated circuit) may be significantly improved.

Figure 5:
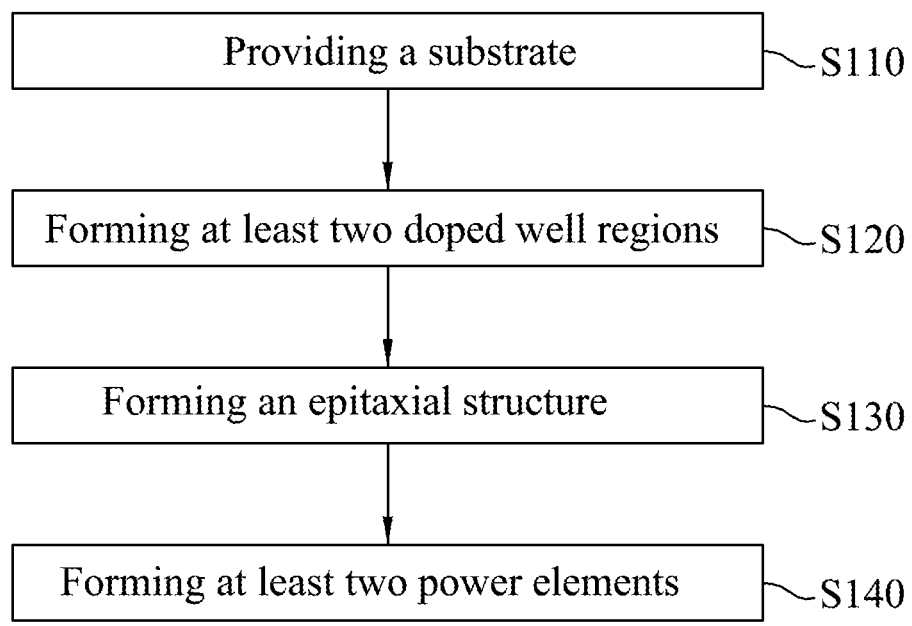
FIG. 5 is a flow chart illustrating the consecutive steps of a method for making the embodiment of the microelectronic device.

Referring to FIG. 5, this disclosure also provides a method for making the embodiment of the microelectronic device 10, which includes the following consecutive steps S110 to S140.

In step S110, the substrate 11 is provided.

In step S120, the at least two doped well regions 12 are formed in the substrate 11, and are spaced apart from each other. Each of the at least two doped well regions 12 has a doping type opposite to that of the substrate 11.

In step S130, the epitaxial structure 13 is formed on the substrate 11, and is in contact with the at least two doped well regions 12.

In step S140, the at least two power elements 14 are formed on the epitaxial structure 13 opposite to the substrate 11. The at least two power elements 14 are cascade connected with each other. Each of the at least two power elements 14 has a high potential terminal and a low potential terminal, and is disposed in correspondence with the respective one of the at least two doped well regions 12. The low potential terminal of each of the at least two power elements 14 is electrically connected to the respective one of the at least two doped well regions 12.

It is noted that additional steps can be added before, after or during the aforesaid steps of the method for manufacturing the embodiment of the microelectronic device 10, and some of the steps described herein may be replaced by other steps or be eliminated.

In sum, by having the spaced-apart doped well regions 12 formed in the substrate 11, and a low potential terminal of each of the power elements 14 electrically connected to the respective one of the doped well regions 12, the substrate 11 and the low potential terminal of each of the power elements 14 may have the same potential, thereby preventing a change or degradation on the performance of the power elements 14 caused by the electrons in the channel layer 133 being trapped into the defects of other epitaxial structures, such as the buffer layer 131, or the highly resistive layer 132.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A microelectronic device, comprising:
    a substrate;
    at least two doped well regions being disposed in said substrate and being spaced apart from each other by said substrate, each of said at least two doped well regions having a doping type opposite to that of said substrate;
    an epitaxial structure disposed on said substrate, and being in contact with said at least two doped well regions, said epitaxial structure including a channel layer that has a first portion and a second portion respectively located above said at least two doped well regions;
    at least two power elements respectively disposed on said first and second portion of said epitaxial structure opposite to said substrate and being cascade connected with each other, each of said at least two power elements having a high potential terminal and a low potential terminal;
    at least two conductive vias that are spaced apart from each other, and that penetrate through said epitaxial structure to respectively contact said at least two doped well regions, said low potential terminal of each of said at least two power elements being electrically connected to the respective one of said at least two doped well regions through a respective one of said conductive vias; and
    an isolation structure formed in said epitaxial structure between said first portion and said second portion to isolate said at least two power elements,
    wherein each of said at least two power elements is disposed on one of said first and second portions above a respective one of said at least two doped well regions;
    wherein each of said power elements includes a source, a drain, and a gate, said drain being said high potential terminal, said source being said low potential terminal, said source of one of said power elements being cascade connected to said drain of the other one of said power elements, said isolation structure being spacedly located above said substrate and being adjacent to one of said conductive vias disposed between said source of said one of said power elements and said drain of said other one of said power elements, which are cascade connected to each other.

2. The microelectronic device of claim 1, wherein each of said at least two conductive vias extends into the respective one of said at least two doped well regions.

3. The microelectronic device of claim 1, wherein said epitaxial structure further includes
    a buffer layer disposed on said substrate and being in contact with said at least two doped well regions;
    a highly resistive layer disposed on said buffer layer opposite to said substrate; and
    a barrier layer disposed on said highly resistive layer, said channel layer being disposed between said highly resistive layer and said barrier layer.

4. The microelectronic device of claim 1, wherein a distance between said at least two doped well regions is not smaller than 1 μm.

5. The microelectronic device of claim 1, wherein each of said power elements is a metal oxide semiconductor field effect transistor, and a source of said metal oxide semiconductor field effect transistor acts as said low potential terminal.

6. The microelectronic device of claim 1, wherein the doping type of said substrate is P-type, and the doping type of each of said at least two doped well regions is N-type.

7. The microelectronic device of claim 6, wherein each of said at least two doped well regions is doped with one of a phosphorus impurity and an arsenic impurity, and has a doping concentration ranging from $10^{17}/cm^3$ to $10^{20}/cm^3$.

8. The microelectronic device of claim 1, wherein the doping type of said substrate is N-type, and the doping type of each of said at least two doped well regions is P-type.

9. The microelectronic device of claim 8, wherein each of said at least two doped well regions is doped with one of an aluminum impurity and a boron impurity, and has a doping concentration ranging from $10^{17}/cm^3$ to $10^{20}/cm^3$.

10. The microelectronic device of claim 1, wherein said substrate is one of a silicon (Si) substrate, a silicon-on-insulator (SOI) substrate, a silicon carbide (SiC) substrate, and combinations thereof.

11. A method for making a microelectronic device, comprising the steps of:
    providing a substrate;
    forming at least two doped well regions in the substrate that are spaced apart from each other by the substrate, each of the at least two doped well regions having a doping type opposite to that of the substrate;
    forming an epitaxial structure on the substrate, the epitaxial structure being in contact with the at least two doped well regions, the epitaxial structure including a channel layer that has a first portion and a second portion respectively located above the at least two doped well regions;
    forming at least two power elements on the epitaxial structure opposite to the substrate, the at least two power elements being cascade connected with each other, each of the at least two power elements having a high potential terminal and a low potential terminal, and being disposed in correspondence with a respective one of the at least two doped well regions, the low potential terminal of each of the at least two power elements being electrically connected to the respective one of the at least two doped well regions;
    forming at least two conductive vias that are spaced apart from each other, and that penetrate through said epitaxial structure to respectively contact said at least two doped well regions, said low potential terminal of each of said at least two power elements being electrically connected to the respective one of said at least two doped well regions through a respective one of said conductive vias; and forming an isolation structure formed in said epitaxial structure between said first portion and said second portion to isolate said at least two power elements, wherein each of said power elements includes a source, a drain, and a gate, said drain being said high potential terminal, said source being said low potential terminal, said source of one of said power elements being cascade connected to said drain of the other one of said power elements, said isolation structure being spacedly located above said substrate and being adjacent to one of said conductive vias disposed between said source of said one of said power elements and said drain of said other one of said power elements, which are cascade connected to each other.

12. The microelectronic device of claim 1, wherein each of said at least two doped well regions has a depth ranging from 0.1 μm to 10 μm.

* * * * *